United States Patent [19]
Borodovsky

[11] Patent Number: 5,532,090
[45] Date of Patent: Jul. 2, 1996

[54] METHOD AND APPARATUS FOR ENHANCED CONTACT AND VIA LITHOGRAPHY

[75] Inventor: Yan A. Borodovsky, Portland, Oreg.

[73] Assignee: Intel Corporation, Santa Clara, Calif.

[21] Appl. No.: 396,961

[22] Filed: Mar. 1, 1995

[51] Int. Cl.$^6$ .................................................. G03F 9/00
[52] U.S. Cl. ........................... 430/5; 430/322; 430/394
[58] Field of Search .............................. 430/5, 322, 394

[56] References Cited

U.S. PATENT DOCUMENTS

| | | | |
|---|---|---|---|
| 4,895,780 | 1/1990 | Nissan-Cohen et al. | 430/5 |
| 5,308,741 | 5/1994 | Kemp | 430/312 |
| 5,424,154 | 6/1995 | Borodovsky | 430/311 |

FOREIGN PATENT DOCUMENTS 58226807  11/1985  Japan .

OTHER PUBLICATIONS

M. Helm, W. Kavanaugh, B. K. Liew, C. Petti, A. Stolmeijer, M. Ben-tzur, J. Bornstein, J. Lilygren, W. Ting, P. Trammel, J. Allan, G. Gray, M. Hartranft, S. Radigan, J. K. Shanmugan, R. Shrivastave, "A Low Cost Processor Compatible, 18.4 um2, 6–T Bulk Cell Technology For High Speed SRAMS," Cypress Semiconductor Corp., pp. 65–66, 1993 Symposium On VLSI Technology Digest of Technical Papers, May 17–19, 1993, The Japan Society of Applied Physics and the IEEE Electron Devices Society.

*Primary Examiner*—S. Rosasco
*Attorney, Agent, or Firm*—Blakely, Sokoloff, Taylor & Zafman

[57] ABSTRACT

An enhanced method and apparatus for forming openings in a photosensitive layer. Using a standard microlithographic printer such as stepper or scan and step system, an unpatterned photosensitive layer is exposed to a first mask having an opening pattern with dimensions within tight (for a given technology generation) process tolerances. Next, prior to development, the photosensitive layer is exposed to a second mask having a grid of clear spaces, surrounding the opening pattern. The combined exposure to the first and second mask forms a latent image of a reduced dimension opening. By the use of two exposures, with the exposure dose for each designed such that intensity profile is easily controllable in the presence of uncontrollable equipment imperfections and process variations, a reduced dimension opening can be formed in a highly manufacturable process with opening sizes smaller than that achievable through conventional lithographic techniques.

23 Claims, 7 Drawing Sheets

FIG_1

FIG_2

FIG_3

FIG_4

FIG_5

FIG_6

FIG_7

FIG_8

FIG_9

METHOD AND APPARATUS FOR ENHANCED CONTACT AND VIA LITHOGRAPHY

BACKGROUND OF THE INVENTION

1. Field of the Invention

The present invention relates to semiconductor devices, and more specifically to a method and apparatus for enhanced contact opening and via lithography.

2. Background Information

In the semiconductor industry, there is a continuing trend toward higher density devices. To achieve these high densities, there has been and continues to be efforts toward scaling down device dimensions. To this end, numerous lithographic methods and apparatus have been investigated to achieve acceptable performance in the deep sub-micron regime.

Many different approaches may be used to increase the resolution of the lithographic process. As used herein, resolution may refer to the dimension of the smallest resolvable feature patterned by a projection system in a photosensitive layer. For example, since the resolution of the optical projection system is proportional to $\lambda/NA$, where $\lambda$ is the wavelength of the exposing radiation, and NA is the numerical aperture of the projection system lens, the dimension of smallest resolvable feature patterned by such projection system may be decreased by decreasing the wavelength of the exposing radiation and/or increasing the numerical aperture of the projection system. While there has been some success with this approach, there are several drawbacks. For example, since the depth of focus is proportional to $\lambda/NA^2$, decreasing the wavelength, and, to a greater extent increasing the numerical aperture, decreases the depth of focus which results in degradation of one's ability to control minimum dimension features in the allowed range of tolerances over the given range of underlying feature topologies. Additionally, other problems exist, such as the increased expense and complexity of systems with the large NA, and the long exposure times, reticle technology, overlay problems and significant other challenges yet to be overcome for very short wavelengths (e.g. E-Beam, X-ray, Ion beam, etc.) technology.

Of particular concern is the patterning of openings such as contact openings and vias in the photo-resist layer. In general, a contact opening is a small dimension square or circular opening in an insulative layer which exposes active regions of a transistor (e.g. source, drain and gate for MOS transistor, emitter, base and collector for bipolar transistor or BJT) to allow for electrical connection thereto, while a via is a small dimension opening in an insulative layer to an underlying metallization layer to allow for electrical connection thereto. Typically, contact/via lithography is less robust than, for example, minimum dimension line and/or space lithography from the same generation of technology due to the poor ability to control variation in the opening size. Primarily, this inability to control the opening size is caused by a relatively faster loss of feature dimension control in out-of-focus conditions for small, evenly spaced openings as compared to lines and/or spaces. In addition, small (close to the resolution limit) openings are subject to significant deviation in their shape in the presence of even small aberrations in the projection system. Further, the limited ability to see the "bottom" of the patterned image of the contact in, for example, SEM microphotographs, usually compounds the problem by limiting the ability to obtain meaningful results of the contact/via lithography process. Moreover, a variance in the feature size on the reticle results in a greater impact on size variation of the patterned features for contacts and vias compared with lines and/or spaces for features with sizes close to the minimum.

The minimum resolution of manufacturing worthy contact/via process (process where degree of feature size control is adequate to meet design tolerances) may be expressed as $A\lambda/NA$, where A is a constant dependent upon the particularly adopted lithographic process. Typically, the value of A is in the range of approximately 0.7–1.0 for many contact/via lithography processes. In contrast, the resolution of line and/or space lithography is typically approximately $0.6/\lambda/NA$ or smaller for advanced manufacturing processes. It is worth noting that the value of A can be reduced significantly if the minimum feature patterned is situated on a pitch that is at least 3 times as large as minimum feature size (or fully isolated), so patterning is less contrast constrained than the case when minimum feature is considered in the context of the pitch that is twice as large (or less) as minimum feature size.

Figure 1:
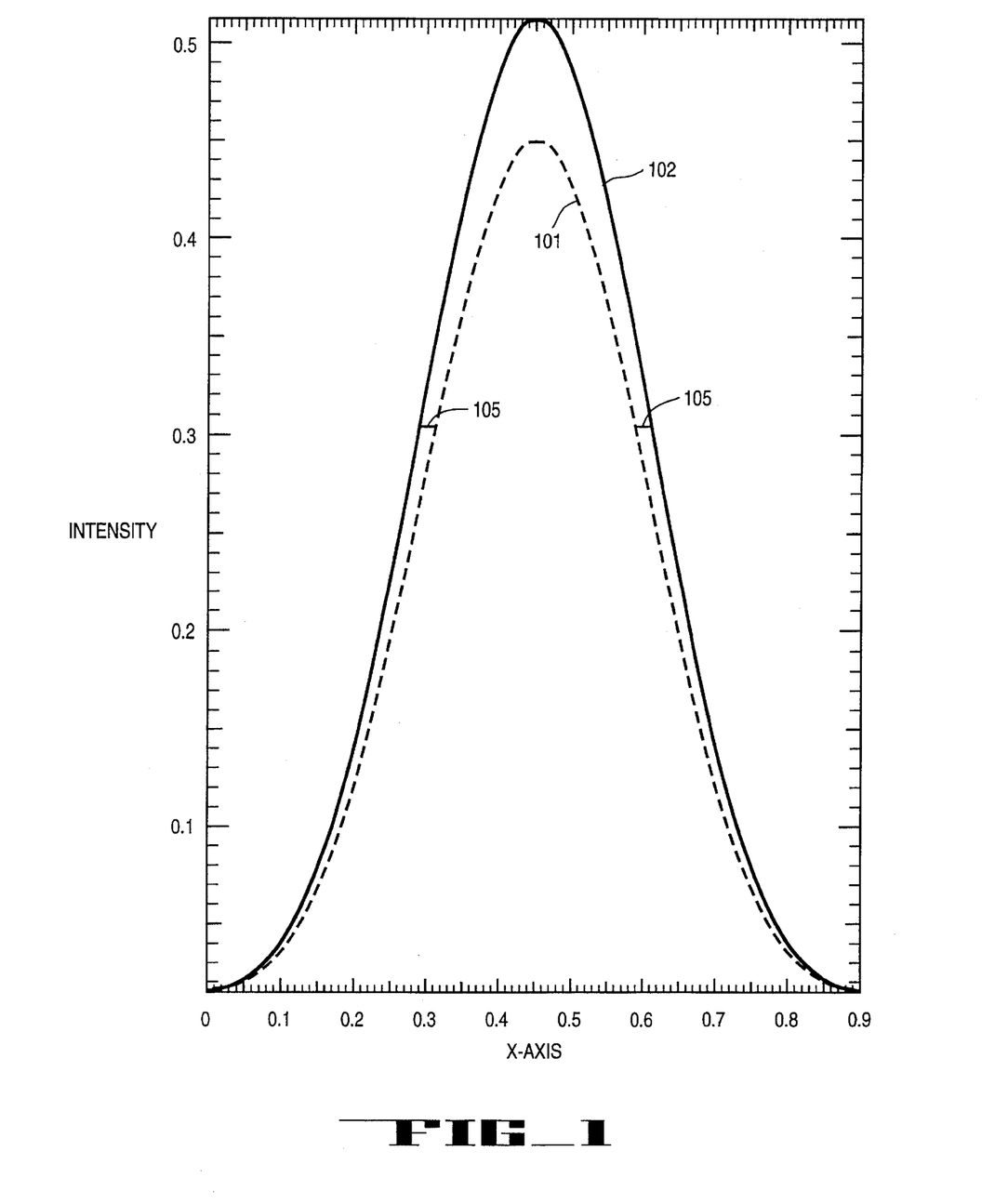
FIG. 1 illustrates the variation in expected feature size resulting from a reticle manufacturing error for equally sized periodic spaces.
Figure 2:
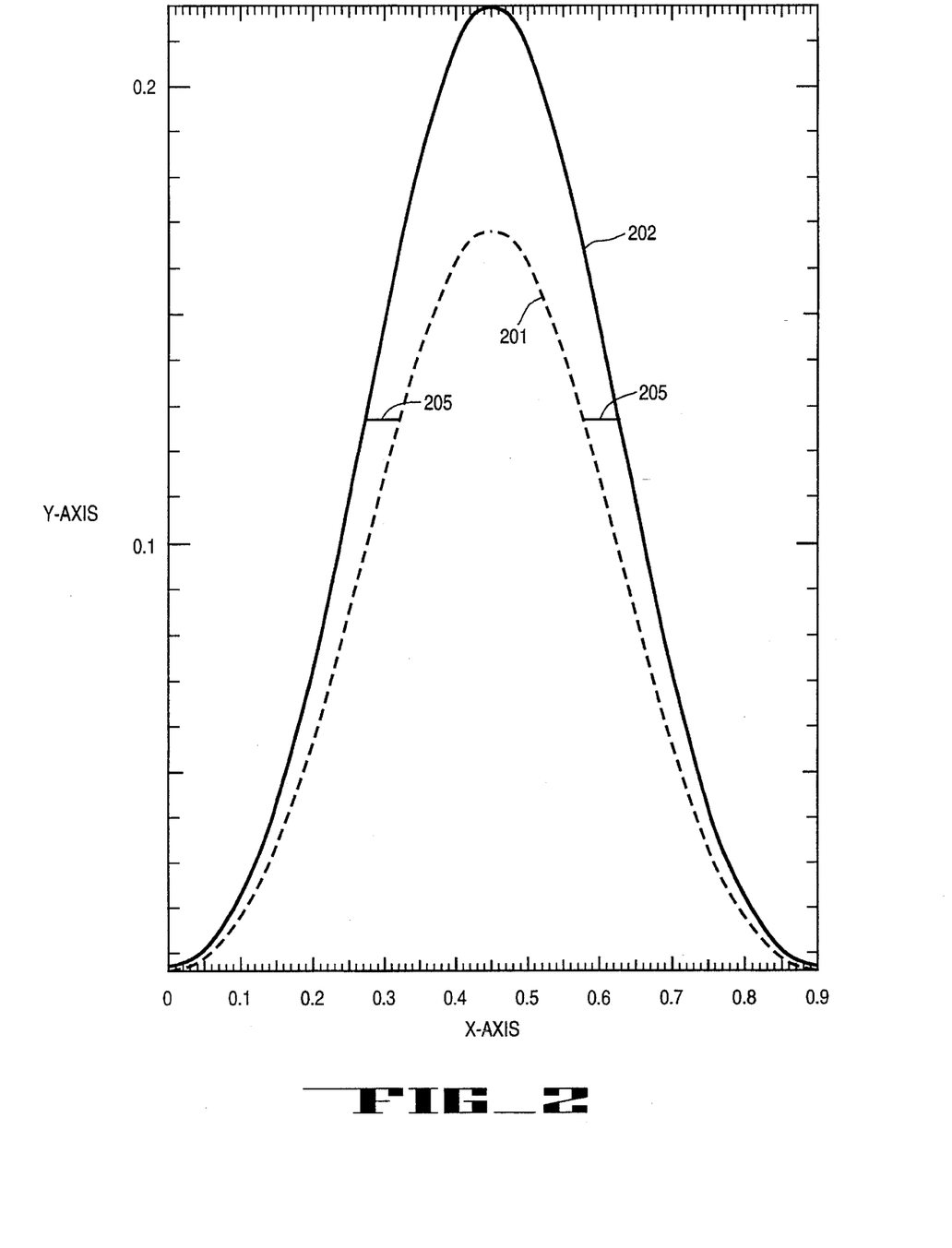
FIG. 2 illustrates the variation in expected feature size resulting from a reticle manufacturing error for equally sized periodic contacts having the same dimension as the spaces of FIG. 1.

Referring to FIGS. 1 and 2, an illustration of the contact/via control problem is shown. In FIGS. 1–2, size variability of a patterned feature due to reticle error is illustrated. In these illustrations, other causes of size variability, such as lens aberrations, are not present. In the graph of FIG. 1, an aerial image of a periodic space is shown. The aerial image is produced for a positive tone reticle having a periodic space with a dimension of 300 nm +/–12 nm at the wafer plane. That is, the mask has a +/–12 nm, or 24 nm total error. The aerial image represents an exposure using 365 nm wavelength exposing light and a projection system with NA=0.50, partial coherence S=0.60 and a reduction ratio of 5:1. As is well known, the dimension of the space in the patterned photoresist layer may be targeted at a dimension different from the reticle dimension by appropriately adjusting the exposure dose. In the present example, it will be assumed that the space is targeted at 300 nm. The curves 101 and 102 represent aerial images of the space for the described situation where the reticle contains the above mentioned small (±–60 nm at the reticle plane for a 5:1 system or ±–12 nm at the wafer plane) reticle manufacturing error. That is, curve 101 represents the aerial image of a feature with a –12 nm error (at the wafer plane) and curve 102 represents the aerial image of a feature with a ±12 nm error (at the wafer plane). As can be seen from the curves, at the targeted dimension of 300 nm, there is a difference 105 between the aerial image 101 and 102 on each side of the feature. Since the distance 105 on each side is approximately 21 nm, the total difference is approximately 42 nm. Thus, a reticle manufacturing error of approximately 24 nm will result in a dimension variation of approximately 42 nm in the patterned resist layer for a periodic space.

FIG. 2 shows an aerial image of a contact to be targeted at 300 nm (900 nm pitch) with a positive tone mask using the same patterning conditions as in FIG. 1 i.e., 365 nm wavelength exposing light and projection system with NA=0.50, partial coherence S=0.60 and reduction ratio of 5:1. The curves 201 and 202 represent aerial images of the contact for the described situation produced by a reticle containing the same small (±–60 nm at the reticle plane or ±–12 nm in the wafer plane) reticle manufacturing error as the space of FIG. 1. As one can see, in the case of a contact, the same reticle manufacturing error of 24 nm will result in a dimension variation 205 of approximately 51 nm per side, or 102 nm total, in the resist, which represents an increase in variability by roughly a factor of 2.5 compared with the space.

Figure 3:
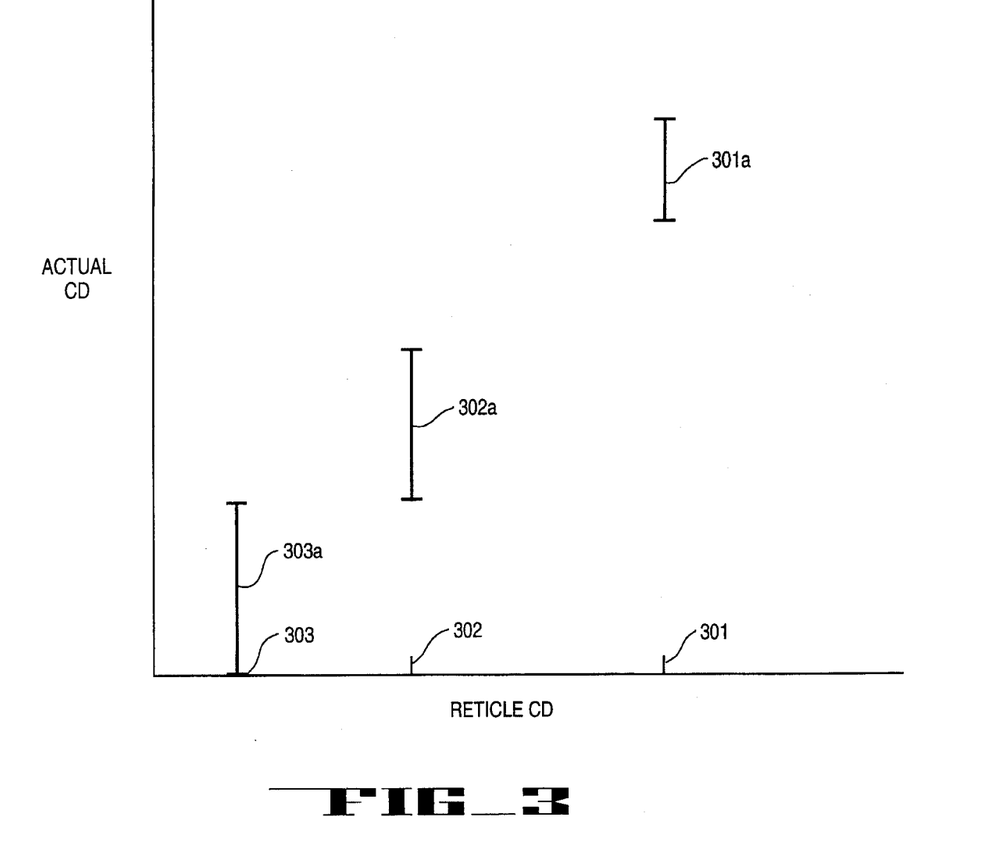
FIG. 3 illustrates the variation in actual CD versus reticle CD for several reticle CD values.

The effect of variability in the size of the patterned contact/via opening, due to reticle error and other causes can be seen in FIG. 3. In the graph of FIG. 3, reticle CD refers to the dimension of the opening on the reticle, and actual CD refers to the dimension of the opening in the photosensitive layer after development. (Alternatively, the actual CD may refer to the dimension of a feature in an underlying layer after an etch step and removal of the photosensitive layer.) For a reticle CD 301, which is significantly larger than the minimally resolved feature, and which may have a value of approximately 1.5%/NA, for example, the actual CD remains within the range 301a. At lower reticle CDs, such as reticle CD 102, the range 102a of actual CDs increases due to the above described increased sensitivity to reticle manufacturing errors, as well as higher sensitivity to residual lens aberrations and loss of contrast in out of focus conditions for a smaller feature. For example, design CD 302 may represent a design CD in the range of approximately $1.0\lambda/NA$. Finally, for very small reticle CDs, such as design CD 303, which may be in the range of approximately $0.4-0.6\lambda/NA$, the range of actual CDs 303a becomes larger still. As can be seen, in some cases the actual CD may have a value of zero, i.e., at least some photosensitive layer remains in all portions of the opening. It will be understood that FIGS. 1–3, and the exemplary dimensions discussed above, are for the purposes of illustration and actual values of reticle CDs and resultant ranges of actual CDs, will vary based upon the technology utilized. However, for any given technology, at some dimension, such as reticle CD 303, there is too great a variation in the size of the opening induced by random and systematic equipment and process variations for the process to be considered manufacturing worthy.

Because the patterning of contact/via openings is far more difficult than the patterning of other features, one prior art approach is to use an opening size approximately 25% or so larger than the minimum line or space dimension which can be achieved in the same technology. For example, while the line and space features may be defined with a reticle CD having a value such as reticle CD 303 of FIG. 1, contact and via openings are defined with a reticle CD having a value 302 of FIG. 1. One drawback with this approach, is that the pattern density is increased compared with openings having the same dimension as the minimum line and space dimension.

Several attempts in the prior art to reduce the variability of small openings have concentrated on providing improved contrast characteristics for contact via patterning in out of focus conditions as described in following paragraphs.

A method which may be used to improve the image contrast in small openings is the focus latitude enhancement exposure (FLEX) method. In this method, multiple exposures of the same reticle at different focal planes is performed. The exposure at each focal plane is partial, such that the total exposure dose is sufficient to image the opening throughout the thickness of the photosensitive layer. In this method, it is difficult to precisely control the focusing and dosage at each focal plane as needed to provide improved control of the feature size variation.

Another approach to produce contact and via openings at minimum geometry is the use of phase-shifted masks. In this method, the central radiation transmitting region of the reticle corresponding to the opening is surrounded by a region which transmits radiation phase-shifted 180° from that transmitted through the central opening portion. The destructive interference which occurs between the opening and the phase-shifter results in improved contrast for a relatively larger range of out of focus conditions. However, dimension tolerance to reticle manufacturing errors is reduced even more due to the dual nature (both amplitude and phase) of reticle errors present. In addition, PSM is a relatively new technology, which still has problems such as mask defects, phase control, need for proximity correction, and others, before becoming a manufacturable technology.

What is needed is a method and apparatus for manufacturably producing openings such as contact and via openings at the minimum feature dimension size for a given technology. The method and apparatus should provide openings with a smaller dimension than currently achievable with the degree of dimensional control that is equal to or better than that for other lithographic features such as lines or spaces. The method and apparatus should allow for improved control over the size variation of the openings of both reduced dimension openings as well as conventionally sized openings. The method and apparatus should provide a robust contact and via lithography process having good ability to control variation in the contact/via size in the presence of sources of variance typical of a given generation of technology. Further, the method and apparatus should not require difficult to implement exposures at several focus planes, should not involve unproven technologies, and should not require expensive and complex equipment beyond what is required for patterning other features.

SUMMARY OF THE INVENTION

A method and apparatus for enhanced contact and via lithography is disclosed. In one embodiment, a substrate having a negative photoresist layer thereon is exposed to a first reticle having a pattern corresponding to the opening pattern to be formed. A first exposure is performed using this first reticle. Next, a second reticle, also having a pattern corresponding to the opening pattern to be formed, is aligned and exposed to the substrate, prior to development. The patterns and exposure doses of the first and second reticle are designed to produce a combined intensity profile and corresponding latent image in the photoresist layer that results in an opening/via pattern of reduced dimension upon resist development. Further, the combined intensity profile has sufficient contrast to achieve improved control of the contact/via size in the presence of sources of variance typical of a given generation of technology. The exposure from the two reticles combined provides small dimensioned contact/via openings with a sufficiently tight distribution of dimensions to provide a manufacturable process equal in its control to similarly sized, non-contact/via features.

Additional features and benefits of the present invention will become apparent from the detailed description, figures, and claims set forth below.

BRIEF DESCRIPTION OF DRAWINGS

The present invention is illustrated by way of example and not limitation in the accompanying figures in which.

DETAILED DESCRIPTION OF THE PREFERRED EMBODIMENT

A lithographic enhancement method and apparatus for forming openings in a photosensitive layer is disclosed. In the following description, numerous specific details are set forth such as specific materials, reticle patterns, dimensions, etc. in order to provide a thorough understanding of the present invention. It will be obvious, however, to one skilled in the art that these specific detail need not be employed to practice the present invention. In other instances, well known materials or methods have not been described in detail in order to avoid unnecessarily obscuring the present invention.

The present invention may be used with any lithographic printer and any lithography process. In a currently preferred embodiment, an i-line projection printer, having a radiation source that emits radiation having a wavelength of approximately 365 nanometers (nm), a numerical aperture (NA) of approximately 0.5 and an image reduction factor (IRF) of approximately 5:1 is used. The 5:1 image reduction factor means that an image on the reticle is reduced by about 5 times by the printer's projection optics when the image reaches the surface of the photoresist layer. For simplicity, features and patterns on the reticle will be described based on the size of the formed image, taking into account the IRF of the printer. Thus, all dimensions described herein are on a 1:1 basis in the image plane unless noted otherwise. It will be appreciated that other types of printers and printers having radiation sources of other wavelengths, other numerical apertures, and other image reduction factors may be used. Further, it will be appreciated that the present invention may be used in conventional lithography processes or may be used in conjunction with other contrast or resolution improving methods such as those described in the background section.

Figure 4:
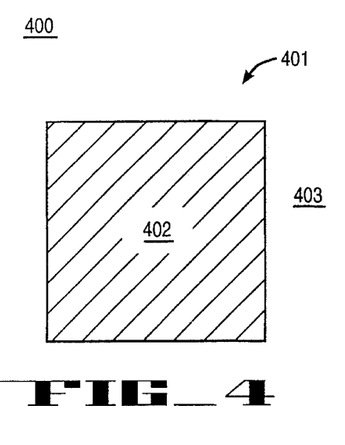
FIG. 4 shows a portion of a first reticle used for a first exposure of a contact/via opening in the resist in the present invention.
Figure 5:
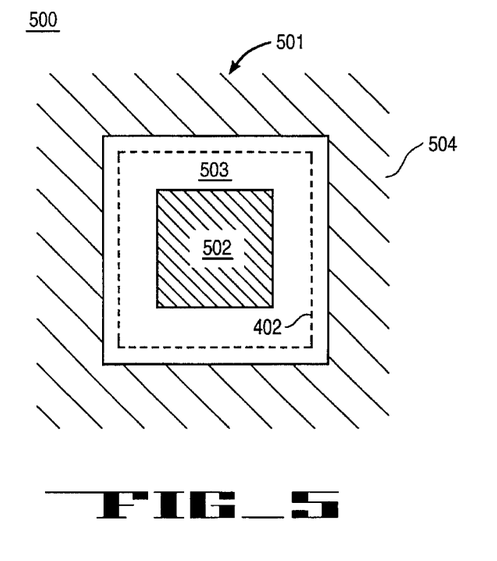
FIG. 5 shows a second reticle used for a second exposure of the same opening as shown in FIG. 4 in the present invention.
Figure 6:
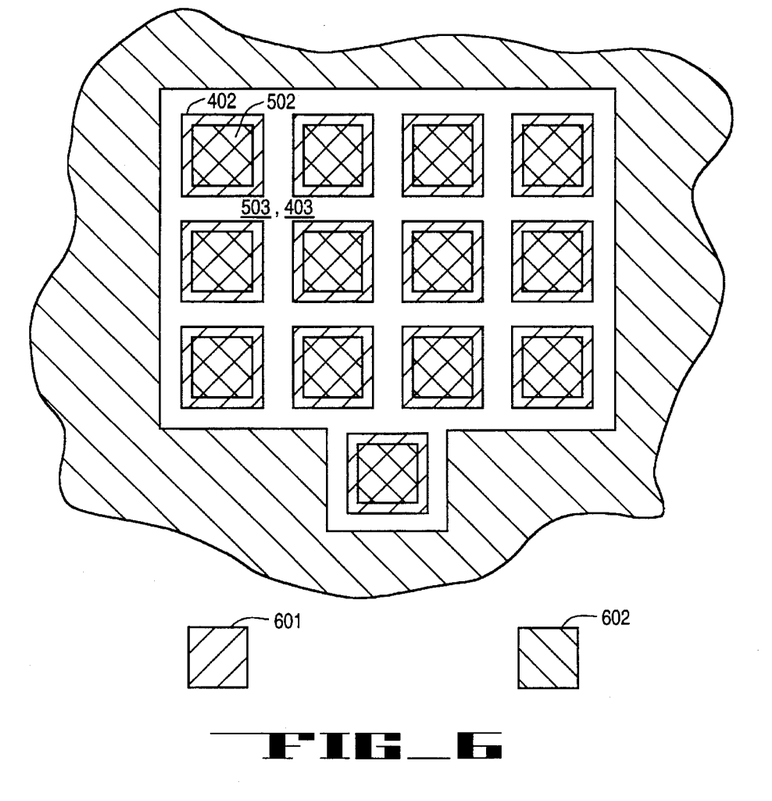
FIG. 6 illustrates the superposition and alignment of a first and a second reticle according to the present invention used to form an array of contact/via openings.
Figure 7:
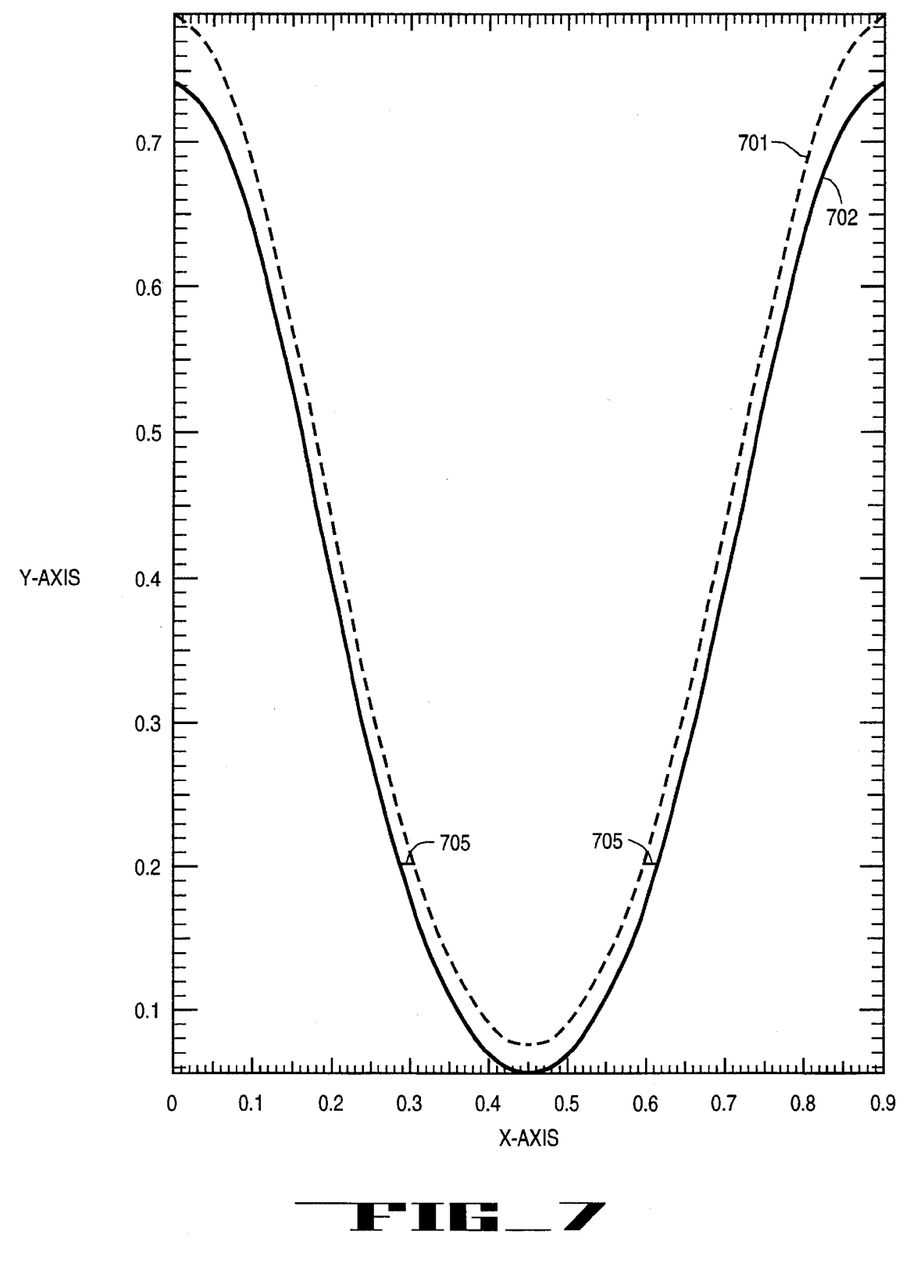
FIG. 7 shows an aerial image under a portion of the first reticle of FIG. 6
Figure 8:
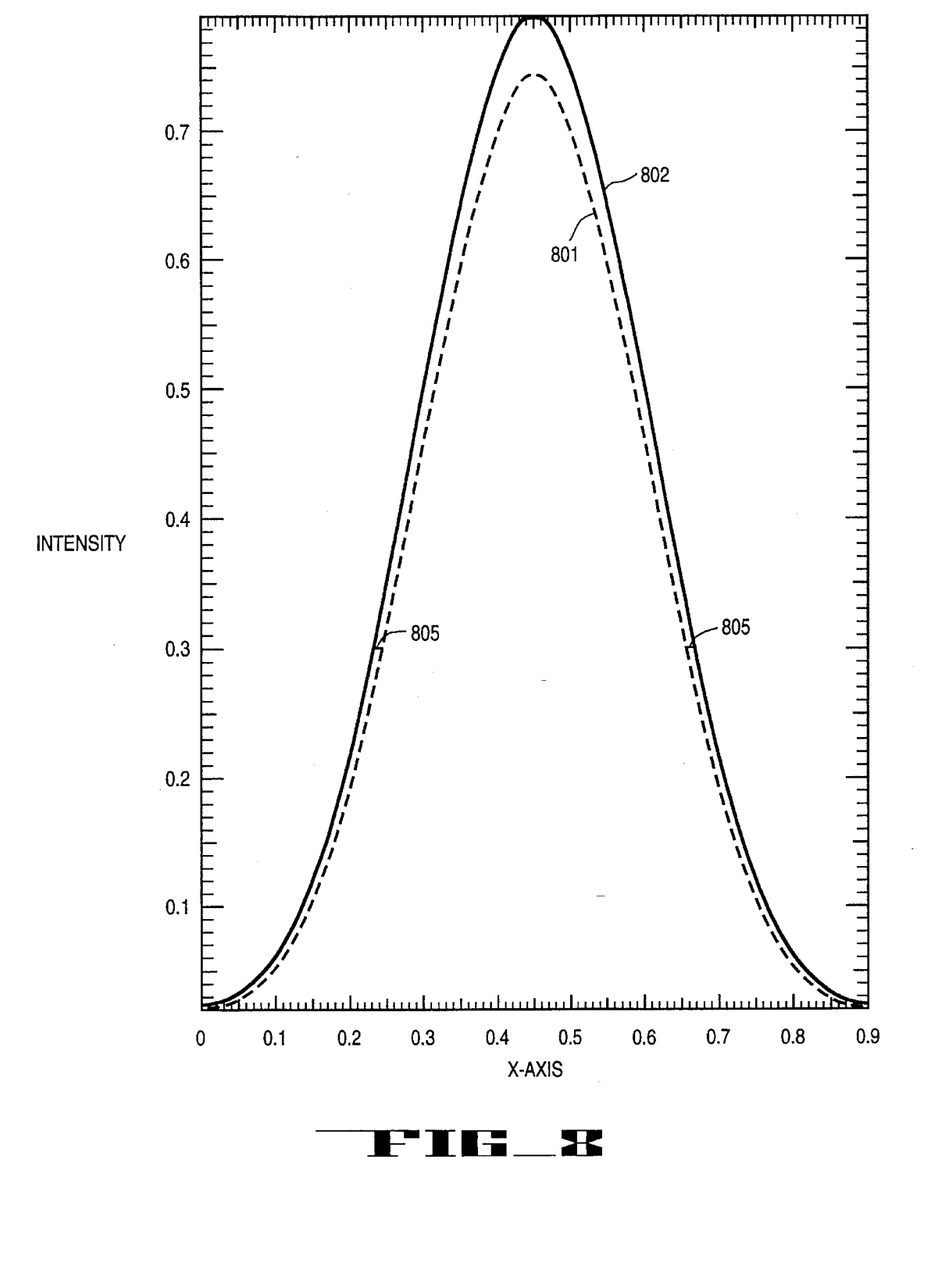
FIG. 8 shows an aerial image under a portion of the second reticle of FIG. 6.
Figure 9:
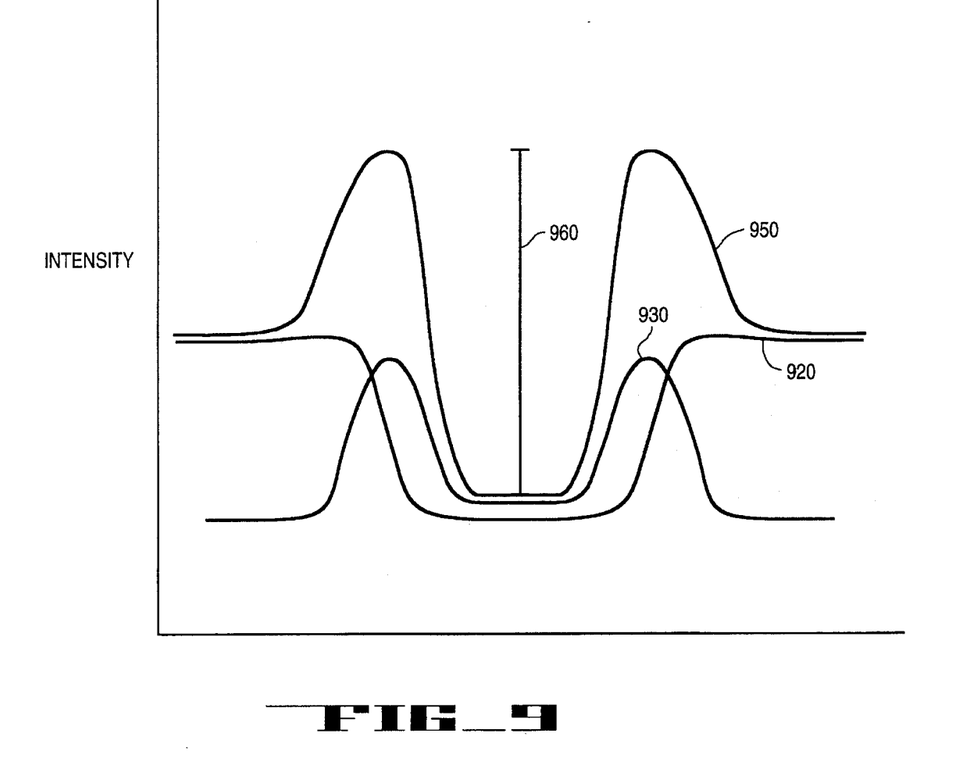
FIG. 9 illustrates the aerial image for the combined exposure of two reticles.

In an embodiment of the present invention, a negative photosensitive layer (e.g. negative photoresist) is exposed to two complementary reticles prior to development, such that the latent image formed is a composite of the two exposures. An example of a portion of each of the reticles according to an embodiment of the present invention is shown in FIGS. 4 and 5. An overlay of two reticles to form an array of openings is shown in FIG. 6. An aerial intensity plot of radiation under a portion of each of the reticles is shown in FIGS. 7 and 8, and a composite aerial intensity of the two exposures is shown in FIG. 9. Although in the following description one reticle is referred to a "first" reticle and another reticle is referred to as a "second" reticle, it will be understood that the present invention can be carried out with exposure to the reticles in any order and that one need not necessarily precede the other. Further, although exposure to two reticles, with no development step in between is described, it will be appreciated that the present invention may be practiced, according to the principles herein, with consecutive exposure to more than two reticles with no development step until all exposures have been performed.

Referring now to FIG. 4, a currently preferred embodiment of a portion of a reticle 400 having feature 401 thereon is shown. As shown, feature 401 comprises substantially opaque region 402 surrounded by radiation transmitting region 403 which transmits at least a portion of radiation incident thereon. In a preferred embodiment, feature 401 is used in the patterning of an opening such as a contact opening, via or other similar opening in the negative photosensitive layer. It will be appreciated that many other features such as feature 401, and, depending upon the particular process, other types of features will be present on the reticle 400. As is well known, when using a negative photosensitive layer, regions of the layer underneath substantially opaque portions of the reticle 400, such as region 402, will be removed upon developing, while regions underneath substantially transparent regions of the reticle 400, such as the region 403 surrounding region 402 will be hardened by the exposure and will remain after development. In a preferred embodiment, feature 401 has a dimension approximately at, or slightly above or below that which may be reliably patterned with a needed degree of process control. For example, in the embodiment described above, feature 401 has an approximate dimension of $0.62\lambda/NA$. As feature 401 is within the resolution of the process, and is of a size such that the image contrast is sufficient throughout the thickness of the photosensitive layer, exposure to reticle 400 may be carried out at an exposure dose at or near that which is typically needed for full exposure of the photosensitive layer. The dimensions of feature 401 and dose may be different from those described above, as will be described in more detail below.

FIG. 5 shows a second reticle 500 used to expose the substrate in the present invention. Feature 501 of reticle 500 comprises a radiation transmitting frame or grid shaped region 503 which surrounds substantially opaque region 502. As shown, region 503 is surrounded by substantially opaque region 504. In a preferred embodiment, the substrate is exposed to reticle 500 either prior to or subsequent to exposure to reticle 400 of FIG. 4, with no development step in-between. The reticle 500 is aligned to the substrate such that region 502 is disposed substantially centered within region 402 of reticle 400 in a currently preferred embodiment. FIG. 5 shows an example of positioning of feature 501 relative to region 402 of feature 401 by dashed outline. In the embodiment shown in FIG. 5, the inner boundary of transparent region 503 is within region 402 and the outer boundary of transparent region 503 extends beyond the edge of region 402, so that the transparent region 503 overlaps the region 402 about the perimeter of region 402. However, in other embodiments, the relative positioning and size of the various regions may be different. For example, the inner boundary of region 503 may be coincident with the outer edge of region of 402, so that the transparent region 503 lies adjacent to the edge of region 402, or the inner boundary of transparent region 503 may extend beyond the edge of the feature 402, so that the transparent region 503 is disposed proximate the edge of region 402 along one or more sides.

In the currently preferred embodiment, region 502 of reticle 500 has a dimension below that which can be used to pattern an opening in a single exposure step. For example, in the above-described embodiment, region 502 has a dimension in the range of approximately 0.2–0.6 λ/NA. As described earlier, typically, due to the nature of small openings, an opening of this size cannot be reliably patterned by use of a single exposure to a reticle having feature 501. However, in the present invention, this limitation is overcome through the combination of exposures. As will be discussed below in conjunction with FIG. 6, the transparent grid (also referred to as "complementary space" herein) region 503 provides for a controllable exposure of the outer portion of the region left unexposed by feature 401, to form a smaller dimension opening than would be formed by feature 401 alone, with good control of size variation.

FIG. 6 shows an embodiment of the present invention for forming an array of openings. FIG. 6 illustrates the overlay of two reticles used to form the array in accordance with the principles of the present invention discussed in relation to FIGS. 4 and 5. One of the reticles comprises a plurality of features similar to feature 401 of FIG. 4 overlaid with a reticle having a grid of transparent regions similar to feature 501 of FIG. 5. Cross hatching in the direction shown by exemplar 601 represents the substantially opaque elements on the first reticle, while cross hatching in the direction shown by the exemplar 602 shows the substantially opaque sections of the second reticle. As shown, each of the regions 402 is aligned with a region 502 disposed approximately centrally therein. As can be seen, in an array of contact/via openings, the grid of transparent regions on the second reticle is formed by the plurality of opaque regions 502 and surrounding transparent regions 503. It will thus be understood that a transparent grid, as used in the present application refers generally to one or more light transmitting regions surrounding an opaque region, which light transmitting region is partially or completely surrounded by one or more opaque regions. There may be a single such grid structure, resembling a frame (as in FIG. 5), or a plurality of grid structures in an array (as in FIG. 6). Further, the grid may have any shape, and need not be square or rectangular as illustrated herein. It will be appreciated that there may be many other arrays or single openings on other portions of the reticles not shown in FIG. 6. Additionally, other features, not requiring the double exposure may be present on one of the reticles.

FIGS. 7 and 8 show aerial images for the previously described lithographic system. Aerial images such as those shown in FIGS. 7 and 8 can be generated using commercially available simulation software such as SAMPLE. FIG. 7 shows an aerial image under region 402 disposed in an array such as that illustrated in FIG. 6. In the aerial image of FIG. 7, the dimension of the region 402 is 450 nm, with ±/–12 nm reticle error at the image plane. The curve 701 represents the image of a feature with –12 nm reticle error and the curve 702 represents the image of a feature with ±12 nm reticle error. As can be seen from the figure, for feature targeted at 300 nm, the variance 705 between the two curves due to reticle error is approximately 16 nm per side, or 32 nm total.

FIG. 8 shows an aerial image for a 420 nm space such as region 503 disposed between 2 regions 502 such as that illustrated in FIG. 6. The aerial image again illustrates the effect of a ±/–12 nm reticle error at the image plane. The curve 801 represents the image of a feature with –12 nm reticle error and the curve 802 represents the image of a feature with ±12 nm reticle error. As shown by the variance 805 between the two curves, at an intensity threshold level of 0.3 or less the expected size variation associated with the space or grid reticle due to reticle manufacturing errors will be approximately 7–10 per side, or 15–20 nm total variance or less.

FIG. 9 shows aerial intensity plots underneath the features 401 and 501. Curve 920 shows the aerial image of a feature 401. As shown, the intensity of radiation is low underneath the substantially opaque region 402 and rises at the edges. Curve 930 of shows the aerial image of feature 501. The intensity is low underneath the substantially opaque region 502 and increases under the radiation transmitting region 503. The intensity then decreases in the region under substantially opaque region 504. The grid structure of reticle 500, by virtue of the two edges alongside the transmitting region 503, provides for good control of the intensity underneath the transmitting region 503 of reticle 500. For further control, the exposure dose used with reticle 500 may be adjusted, for example, to be less than that needed for full exposure. Thus, the contribution to the total intensity from reticle 500 provides exposure at the edge of the latent image of the opening formed by reticle 400, thereby forming a small dimension opening with good control.

As noted above in relation to FIG. 8, at a certain intensity level, the total variance 805 of a periodic space due to reticle error is relatively small. Therefore, it will typically be desirable to place the features such as 401 and 501 relative to one another such that the image of the opening 503 dictates the variance at the edge of the feature. That is, the sensitivity to reticle manufacturing error shown in relation to FIG. 7 for the region 402 is overridden by the more robust (less sensitive) behavior of the complementary space 503, thus achieving the desired degree of feature dimensional control.

Referring to curve 950 of FIG. 9, the effects of the two exposures can be seen. The curve 950 comprises the combined intensity of curves 920 and 930. Thus, curve 950 shows the intensity plot which forms the latent image after exposure to reticle 400 and 500. As shown, the intensity stays uniformly low, as desired and then rises sharply. Because curve 950 results from the combined exposure of features 401 and 501, the difference in intensity 960 between the center of the feature and the edge of the feature—that is, the contrast—is much greater for the combined exposure than for either exposure alone. Thus, high contrast and good dimensional control, not obtainable in a single exposure, may be achieved with multiple exposure according to the present invention.

As described above, the present invention comprises performing more than a single exposure prior to development. In one embodiment, a reticle 400 has a feature size within process capabilities, and a second reticle comprises a frame or grid pattern having a central opaque region which may have a dimension below that which the process is able to image reliably in a single exposure. One or both reticles may be exposed with a radiation dose approximately equal to that sufficient to essentially completely harden exposed regions of the resist. However, unless a reticle is also used to pattern features which are not present on the other reticle, i.e., covered by an opaque element in the other reticle, the reticle may have an exposure dose below this since it is the combined exposure of both reticles that is important for the purpose of patterning the opening. If desired, one reticle may be exposed with a larger dose, for example, the reticle having the feature 401 may be exposed with a large dose to increase the diffracted radiation near the feature edge. This may be desirable where the exposure of feature 501 is carried out at a relatively low exposure, to ensure that there is sufficient combined intensity near the feature's edge.

In some embodiments, the dimensions of the features and regions may be different from those described above. For example, both reticles may have dimensions at or above those which may be reliably patterned in the particular generation of technology, or, alternatively, both reticles may have dimensions below that which may be reliably patterned in the particular technology. As described above, it is the effect of the combined exposure that is important. Further, the present invention need not necessarily be used to provide for smaller dimensioned openings than the technology is capable of in a single exposure, but instead may be used as a means for increasing process latitude.

Although the present invention has been illustrated using a reticle 400 having a substantially square feature and a reticle 500 having a frame or grid open region 503 surrounding a square, opaque region 502, and has been illustrated with similar reticles having an array of such features, it will be appreciated that other shapes and configurations may be used if desired. Additionally, although specific alignment of the reticles has been shown, other arrangements may be used. For example, the opaque regions 402 and 502 may fully or partially overlap one another, may lie along an edge at one side, etc., depending upon the desired shape and characteristics of the patterned opening. As described above, use of the transparent grid on the reticle 500 provides for good control of the radiation intensity due to the presence of two edges. However, in some embodiments this grid structure may not be necessary, so that a first reticle may comprise a feature 401 of reticle 400, and a second reticle may comprise only the opaque region 502 of reticle 500. Alternatively, a partial grid structure may be used, wherein a transmitting region 503 is only partially surrounded by one or more opaque regions. Additionally, the present invention is not limited to use of exposure to two reticles, but may, using the principles described herein, be performed with consecutive exposure to more than two reticles.

In any embodiment, a set of two or more reticles may be fabricated. As described above, a set may consist of a reticle 400 and a reticle 500, or may consist of reticles with alternative features and dimensions as described above. The choice of the reticle 400 and reticle 500 dimensions can be found through commercially available simulation tools or empirically utilizing aerial image sampling and optimization that can be performed through the use of aerial image measurement system (AIMS), such as that available from Zeiss and IBM, for each reticle. A composite image such as that illustrated by curve 950 of FIG. 9 can be computed to determine if the set of reticles meets the user's requirements. Further, in this regard, these plots may be performed for a variety of out of focus conditions to determine whether the chosen feature size and exposures meets the contrast requirement for the resist layer being patterned. The feature dimensions, configurations, alignment, and the exposure dose for the two reticles should be designed such that the intensity profile is easily controllable in the presence of uncontrollable equipment imperfections and process variations to enable forming a reduced dimension opening in a highly manufacturable process. In addition to the use of the above described simulation tools, and aerial image sampling, exposure of a photosensitive layer to a set of "characterization" reticles, having different feature sizes and/or configurations and/or relative alignments, may be carried out, at a variety of exposure doses, to determine the proper sizing, configuration, alignment and exposure for each reticle.

Thus, a method and apparatus for patterning an opening in a photosensitive layer is described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

I claim:

1. A method of forming a pattern in a photosensitive layer comprising the steps of:

performing a first exposure to radiation, said first exposure exposing a first region of said photosensitive layer while leaving a second region substantially unexposed;

performing a second exposure to radiation, said second exposure exposing a third region of said photosensitive layer while leaving a fourth region substantially unexposed, wherein at least a portion of said third region is disposed near, adjacent to, or overlapping an edge of said second region such that an intensity profile with improved contrast is realized compared with said first and second exposures alone; and, developing said photosensitive layer.

2. The method as described in claim 1 wherein said first exposure comprises exposing one or more of said first regions while leaving a plurality of said second regions unexposed, said second regions arranged in an array, and wherein said second exposure comprises exposing one or more of said third regions arranged in a grid disposed about said plurality of said second regions.

3. The method as described in claim 2 wherein said one or more first regions surrounds each of said plurality said second regions, and said one or more third region surrounds each of said plurality said fourth regions.

4. The method as described in claim 3 wherein one of said second and said fourth regions is disposed within the other of said second and said fourth regions.

5. The method as described in claim 2 wherein one of said second and said fourth regions is disposed within the other of said second and said fourth regions.

6. The method as described in claim 1 wherein said first region surrounds said second region, and said third region surrounds said fourth region.

7. The method as described in claim 6 wherein one of said second and said fourth regions is disposed within the other of said second and said fourth regions.

8. The method as described in claim 1 wherein one of said second and said fourth regions is disposed within the other of said second and said fourth regions.

9. A method of forming a pattern in a photosensitive layer comprising the steps of:

exposing said photosensitive layer to a first reticle, said first reticle having a first pattern comprising a first substantially opaque region thereon; and, exposing said photosensitive layer to a second reticle, said second reticle having a second pattern comprising a second radiation transmitting region thereon, wherein in a first image of said first pattern and a second image of said second pattern formed in said photosensitive layer, at least a portion of said second image corresponding to said radiation transmitting region is disposed near, adjacent to, or overlapping at least a portion of said first image corresponding to said substantially opaque region such that said pattern in said photosensitive layer has an intensity profile with improved contrast in comparison to an exposure with said first reticle alone and said second reticle alone.

10. The method as described in claim 9 wherein said first reticle comprises a plurality of said first substantially opaque regions arranged in an array, and wherein said second reticle comprises one or more of said second radiation transmitting regions arranged in a grid, at least a portion of said second image corresponding to said one or more radiation transmitting regions disposed near, adjacent to, or overlapping at least a portion of said first image corresponding to each of said plurality of said substantially opaque regions.

11. The method as described in claim 10 wherein said first pattern comprises said plurality said first substantially opaque region surrounded by one or more first radiation transmitting regions and said second opening pattern comprises a plurality of second substantially opaque regions surrounded by said one or more second radiation transmitting regions.

12. The method as described in claim 11 wherein said first image of said first opening pattern comprises a first substantially unexposed region and said second image of said second pattern comprises a second substantially unexposed region, wherein one of said first and said second substantially unexposed regions is disposed within the other of said first and said second substantially unexposed regions.

13. The method as described in claim 10 wherein said first image of said first opening pattern comprises a first substantially unexposed region and said second image of said second pattern comprises a second substantially unexposed region, wherein one of said first and said second substantially unexposed regions is disposed within the other of said first and said second substantially unexposed regions.

14. The method as described in claim 9 wherein said first pattern comprises said first substantially opaque region surrounded by a first radiation transmitting region and said second opening pattern comprises a second substantially opaque region surrounded by said second radiation transmitting region.

15. The method as described in claim 14 wherein said first image of said first opening pattern comprises a first substantially unexposed region and said second image of said second pattern comprises a second substantially unexposed region, wherein one of said first and said second substantially unexposed regions is disposed within the other of said first and said second substantially unexposed regions.

16. The method as described in claim 9 wherein said first image of said first opening pattern comprises a first substantially unexposed region and said second image of said second pattern comprises a second substantially unexposed region, wherein one of said first and said second substantially unexposed regions is disposed within the other of said first and said second substantially unexposed regions.

17. A mask set comprising:

a first mask, said first mask having a first pattern comprising a first substantially opaque region thereon, and a second mask, said second mask having a second pattern comprising a second radiation transmitting region thereon, wherein said first and said second mask have an aligned position, wherein when said first mask and said second mask are in said aligned position, at least a portion of said second radiation transmitting region is disposed near, adjacent to, or overlapping at least a portion of said first substantially opaque region such that when a first exposure is made onto a photosensitive layer with said first mask, and then a second exposure is made onto said photosensitive layer with said second mask, a resulting composite image is formed having an intensity profile with improved contrast in comparison with an image made with said first and second masks alone.

18. The mask set as described in claim 17 wherein said first mask comprises a plurality of said first substantially opaque regions arranged in an array, and wherein said second mask comprises one or more of said second radiation transmitting regions arranged in a grid, wherein at least a portion of said one or more second radiation transmitting regions is disposed near, adjacent to, or overlapping at least a portion of each of said plurality of said first substantially opaque regions.

19. The mask set as described in claim 18 wherein said first pattern comprises said plurality of said first substantially opaque regions surrounded by one or more first radiation transmitting regions and said second opening pattern comprises one or more second substantially opaque regions surrounded by said one or more second radiation transmitting regions.

20. The mask set as described in claim 19 wherein in said aligned position, one of said first and said second substantially opaque regions is disposed within the other of said first and said second substantially opaque regions.

21. The mask set as described in claim 17 wherein said first pattern comprises said first substantially opaque region surrounded by a first radiation transmitting region and said second opening pattern comprises a second substantially opaque region surrounded by said second radiation transmitting region.

22. The mask set as described in claim 21 wherein in said aligned position, one of said first and said second substantially opaque regions is disposed within the other of said first and said second substantially opaque regions.

23. A method of forming a pattern in a photosensitive layer comprising the steps of:

performing a first exposure to radiation, said first exposure exposing a first region of said photosensitive layer while leaving a second region substantially unexposed;

performing a second exposure to radiation, said second exposure exposing a third region of said photosensitive layer while leaving a fourth region substantially unexposed, wherein at least a portion of said third region is disposed near, adjacent to, or overlapping an edge of said second region, wherein one of said second and said fourth regions is disposed within the other of said second and said fourth regions; and, developing said photosensitive layer.

* * * * *